[54] LASER ACTIVATED SUPERCONDUCTING SWITCH

[75] Inventor: Alfred A. Wolf, R.F.D. 3, Box 327, Annapolis, Md. 21402

[73] Assignee: The United States of America as represented by the Secretary of the Navy, Washington, D.C.

[22] Filed: Dec. 16, 1974

[21] Appl. No.: 533,116

[52] U.S. Cl. .......................... 338/32 S; 174/15 CA; 307/245; 307/306; 335/216; 357/18
[51] Int. Cl.² ............................................. H01C 7/16
[58] Field of Search .......... 338/32 S; 307/245, 306, 307/277; 335/216; 174/DIG. 6; 357/5, 18, 19

[56] References Cited
OTHER PUBLICATIONS

L. R. Testardi, *Destruction of Superconductivity by Laser Light*, "Physical Review," B, Vol. 4, No. 7, pp. 2189–2196, Oct. 1, 1971.

Chang and Scalapino, *New Instability in Superconductors under External Dynamic Pair Breaking*, "Physical Review," B, Vol. 10, No. 9, Nov. 1, 1974, pp. 4047–4049.

*Primary Examiner*—C. L. Albritton
*Attorney, Agent, or Firm*—R. S. Sciascia; Q. E. Hodges; D. McGiehan

[57] ABSTRACT

A superconducting switch or bistable device comprising a superconductor in a cryogen maintaining a temperature just below the transition temperature, having a window of the proper optical frequency band for passing a laser beam which may impinge on the superconductor when desired. The frequency of the laser is equal to or greater than the optical absorption frequency of the superconducting material and is consistent with the ratio of the gap energy of the switch material to Planck's constant, to cause depairing of electrons, and thereby normalize the superconductor. Some embodiments comprise first and second superconducting metals. Other embodiments feature the two superconducting metals separated by a thin film insulator through which the superconducting electrons tunnel during superconductivity.

9 Claims, 5 Drawing Figures

LASER ACTIVATED SUPERCONDUCTING SWITCH

The invention described herein may be manufactured and used by or for the Government of the U.S. of America for governmental purposes without the payment of any royalties thereon or therefor.

BACKGROUND OF THE INVENTION

The instant invention relates generally to super-conductivity and more particularly to a superconducting switch activated to "on" or "off" by an appropriate laser beam.

In the technology of electronics and energy conversion, superconducting devices and systems are becoming more and more prominent. The use of superconducting wave guides, superconducting magnetometers, superconducting magnets, superconducting inductors, superconducting electrical machinery, and other superconducting devices are now part of the state of the art. With many of these devices, the use of switches that are of the superconducting type are desirable, and sometimes required as part of the circuits involved.

Prior art superconducting switches generally consist of a length of superconductor with a method of heating it. For example, a small heating element may be wrapped around a small fraction of the length of the superconductor, or radiant light energy may impinge upon the superconductor to form a hot spot to raise its temperature. In either case, transition from the superconducting zero resistance to the resistive state is induced by means radiant energy heating the superconductor to above the transition temperature, and thus the superconductor becomes "normally conductive." Since most superconductors are generally highly resistive in their "normal" state, a bistable switch action is thus effected.

There are major disadvantages in the prior art switches. In the directly heated switch, a heater wire element must be wrapped around the superconductor and its leads brought out from the Dewar to an outside power source. Due to the heating, helium boil-off occurs along the length of the superconductor and heater wire element, especially where the heater wire is in contact with the helium bath and the superconductor. The radiant light energy type switch has some advantages over the wrapped heating wire element type, since the light can perform remote switching and the heating wire element is eliminated. However, the problems of helium boil-off and recooling are not eliminated because a great deal of light energy is required to heat the superconductor.

As suggested hereinbefore, it is well known that certain materials lose all apparent electrical resistance (superconduct) when subjected to very low temperatures near absolute zero. The transition from the resistive state to the superconductive state occurs abruptly at a critical temperature known as the transition temperature. It is also known that a transition from a superconductive state to a resistive state can be induced by applying a magnetic field to the superconductor. The magnetic field may be focused on the superconductor externally or induced internally by the flow of current in the superconductor wire when the current exceeds a critical value.

This invention capitalizes on the fact that superconductivity evidently arises from the pairing of electrons with equal and opposite momenta, and equal and opposite spins. Conversely, if superconducting is caused by pairing, then normalization is caused by depairing. Consequently, if the energy level of the electrons in the superconducting state is raised, as by pumping the electrons with a laser beam, so that the electrons are depaired, the superconducting material is normalized at the point of illumination.

SUMMARY OF THE INVENTION

Accordingly, an object of the instant invention is to provide a new and improved superconducting switch. Another object of the present invention is to provide a superconducting switch that can be controlled remotely.

Still another object of the present invention is to minimize helium boil-off when making the superconducting switch go normal.

A further object of the instant invention is to provide a superconducting switch wherein the switching is confined to a point along a wire.

Still another object of the invention is to provide a superconducting switch which may be rapidly switched from superconducting to normal and reverse to the point of oscillation.

Another object of the invention is to provide a superconducting switch that is controlled by pairing and depairing of electrons by optical means.

A still further object of the instant invention is to provide a superconducting switch that requires no heating above the critical temperature to go normally conductive from the superconductive state.

Briefly, these and other objects of the instant invention are attained by the use of a length of superconducting wire bathed in a cryogen contained in a Dewar having a window through which a laser beam may pass to impinge upon a portion of the superconductor when desired. Below the transition temperature, the superconductor wire is superconducting and is "normalized" by optical absorption of the photons from the laser beam illumination. It is the frequency of the laser beam being at, or above the optical absorption frequency of the superconductor rather than the intensity that is responsible for the switching action. Hence, no heat is generated by the laser in the switching action to heat the superconductor and cause undesirable helium boil-off.

BRIEF DESCRIPTION OF THE DRAWINGS

A more complete understanding of the invention and many of the attendant advantages thereof will be appreciated as the same become better understood by reference to the following detailed description when considered in connection with the accompanying drawing wherein.

DESCRIPTION OF THE PREFERRED EMBODIMENTS

Figure 1:
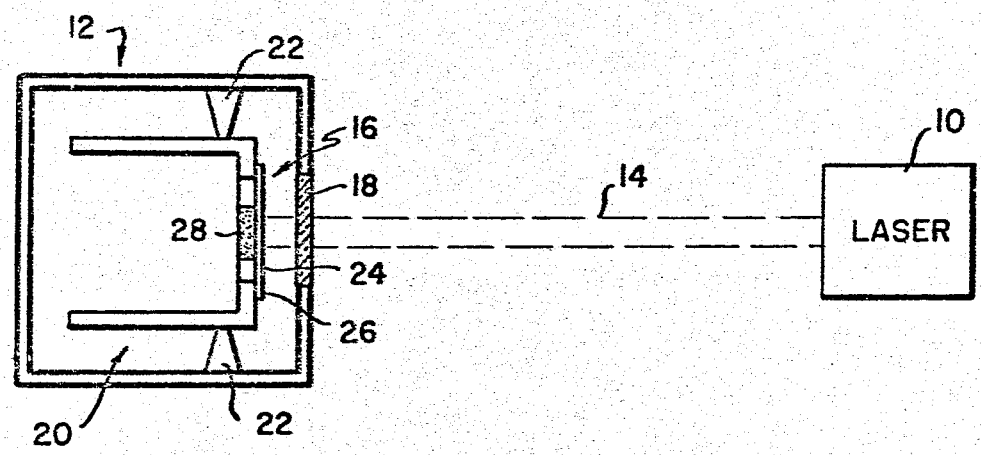
FIG. 1 is a cut-away side view of the superconductor complete switching arrangement.

Referring now to the drawings wherein like reference numerals designate corresponding parts throughout the several views, there is shown generally in FIG. 1 a laser-activated superconducting switch, having a laser 10 and a cryogenic chamber, such as a Dewar 12.

The laser 10 emits a photon beam 14 of low power having a frequency at, or above the optical absorption frequency of a superconductor switch 16 located in the Dewar 12. The beam 14 is directed through a window 18 mounted in the Dewar 12 and which will pass the frequency of the laser beam. The frequency of the laser must be at, or above the optical absorption frequency of the superconductor switch material, and furthermore, must be at the critical depairing frequency of the switch material. The critical depairing frequency of the laser is given by the formula:

$$f_c = \Delta/\pi h \text{ or } = 3.5 \, K_B T_c/h = 729 \text{GHz}/°K;$$

where $f_c$ denotes the critical depairing frequency, $h$ denotes Planck's constant, $\Delta$ denotes the half gap energy, $\hbar$  $h/2\pi$ $K_B$ denotes Boltzmann's constant, °K denotes degrees Kelvin, and $T_c$ denotes the transition temperature of the superconducting switch material.

The beam impinges upon the superconductor switch 16 maintained below its critical temperature by a cryogen 20, such as liquid helium in the Dewar 12. A pair of post insulators 22 made of ceramic or the like secure the superconductor switch 16 rigidly to the Dewar.

Figure 2:
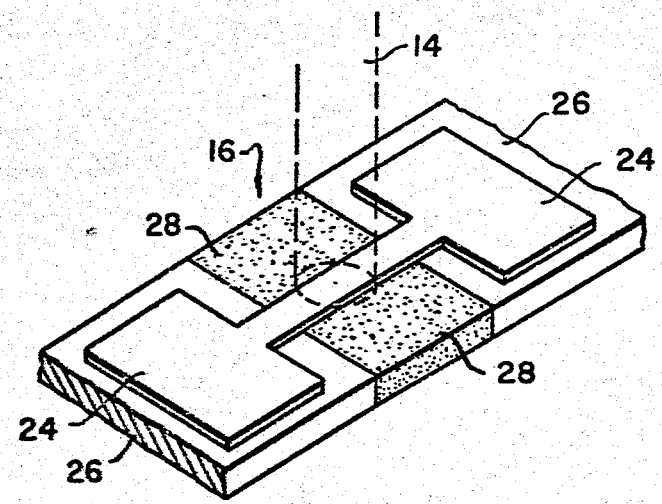
FIG. 2 is a perspective view of the details of an embodiment of the superconductor element of FIG. 1.

This embodiment of the superconductor switch 16 shown in FIG. 1, but in better detail in FIG. 2, is made up of a thin superconductor element 24, in the form of a capital "I", electrically connected at its ends to the two opposing ends of a superconductor wire strip 26. A ceramic piece 28 is bonded to and mechanically and electrically isolates the two ends of the superconductor strip 26.

The embodiment of FIG. 1 and 2 is designed to switch large currents that produce high magnetic fields. Therefore the wire strip 26 will be made of a type II superconductor which will maintain a zero resistance (superconducting) in the presence of the naturally induced high magnetic field. The actual superconductor switch element 24 may be material chosen from a type I superconductor such as lead, tin, mercury, but need not be, if the latent heat of transformation of type II materials is acceptable in the switching application. Generally speaking, under proper conditions the specific heat drops for a type I superconductor in a zero magnetic field. In a constant non-zero magnetic field, the latent heat of transformation from the superconducting to the normal state is absorbed. A similar condition occurs at the upper critical field of a type II superconductor. It is to be understood in this and other embodiments that the laser beam 14 is larger than the width of the central portion of the capital "I" shaped element 24, and that the central portion is not so narrow as to cause the well known and undesirable "weak link" action. A "weak link" is a region joining two superconductors which has a considerably lower critical current than the superconductors it joins and into which magnetic fields can penetrate.

In operation, the superconductor switch 16 is maintained below its critical temperature and is therefore superconducting, i.e., has zero resistance, by the cryogen 20 in the Dewar 12. It is known that most superconductors have a photon absorption and depairing frequency which may be determined by the equation, $f_c = 729 \, T_c$; where $f_c$ is the critical depairing optical absorption frequency, which must equal or exceed the absorption frequency, $T_c$ is the transition temperature in degrees Kelvin, and 729 is a constant derived from 3.5 times the ratio of Boltzmann's constant to Planck's constant. This frequency from the equation sets the minimum level for the laser frequency operation. Thus the laser beam 14 of this or a higher frequency and of low power passes through the window 18, which will admit such frequency, to impinge upon the superconductor element 24. The impingement of the proper photon frequency causes electron depairing; that is, the Cooper pairs jump the energy gap from the valence band to the conduction band. Thus the element 24 goes normal and exhibits a relatively high resistance compared to superconduction to produce a switch action to "off".

Figure 3:
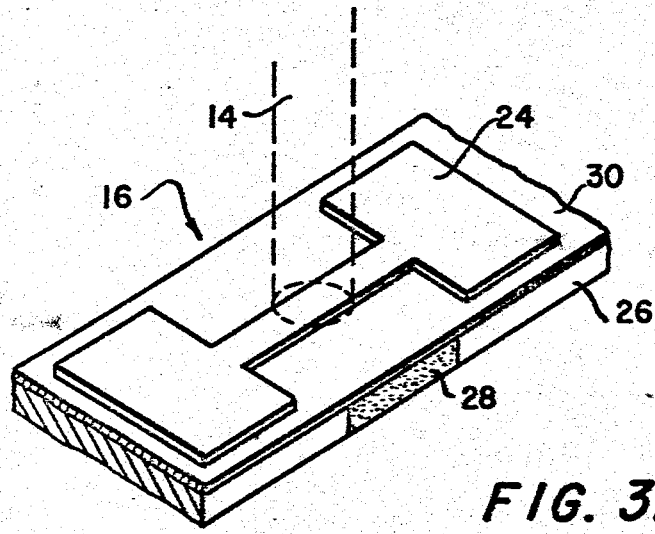
FIG. 3 is a perspective view of another embodiment of a superconductor element having a thin film insulator.

Referring now to FIG. 3 another embodiment of the invention is shown. Here the superconductor element 24 in the form of a capital "I" is separated from the superconductor strip 26, which may be type II superconductor, by a intervening thin film insulator 30 such as a ceramic. A ceramic piece 28, such as in the FIG. 1 & 2 embodiments, mechanically and electrically isolates the two ends of the strip 26. The thin film insulator 30 must have a thickness of 10 Angstroms or less and may be vacuum deposited by well known techniques onto the strip 26. The superconductor element 24 is then bonded over the thin film insulator and may be type I superconductor as in the FIG. 1 & 2 embodiments depending on usage.

The operation of this embodiment is similar to the embodiment of FIG. 1 & 2, except that "tunnelling" occurs through the thin film insulator 30 between the superconductor element 24 and the strip 26. This tunnelling has some similarity, under certain conditions to semiconductor tunnelling. With tunnelling occurring across a gap between identical or disimilar superconductors, requirements on the energy levels between the superconductors may differ markedly from the kind of tunnelling that occurs in semiconductors or between metals separated by the thin film insulator 30 through which electrons may travel. The tunnelling which occurs during superconduction, attains substantially zero resistance for the superconductor switch 16. When the laser beam 14 impinges upon the superconductor element 24 it goes normal and also the tunnelling ceases. Therefore the superconductor switch 16 becomes highly resistive, to produce a higher resistance ratio between "on" and "off", and thus is better switch than the embodiment of FIG. 1 and 2 for certain applications.

Figure 4:
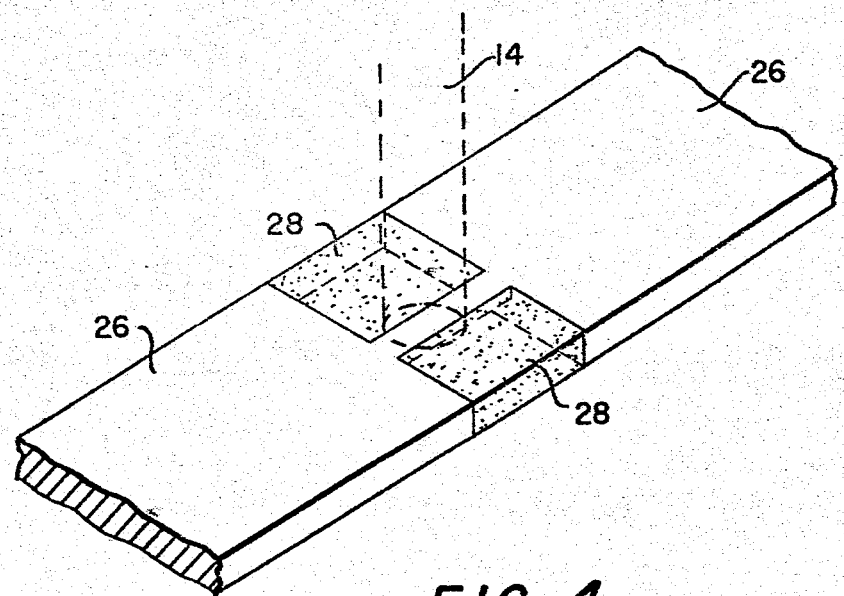
FIG. 4 is a perspective view of still another embodiment of a superconductor element using an integral piece of superconducting material.

Referring now to FIG. 4 another embodiment of the invention is shown. Here the superconductor element 24 is an integral part of superconductor strip 26 and therefore they will be of the same type superconductor material. A ceramic piece 28 is formed around the element 24 between the sections of strip 26 for rigidity.

The operation of this embodiment is substantially the same as the others. However, being an integral piece, the switch element 24 and the strip 26 are necessarily of the same material. If there are no high magnetic fields to be generated in the superconductor, a type I superconductor may be selected. If a type II superconductor is used, a small amount of latent heat of transformation is absorbed when the material goes normal at the upper critical field. It is to be reiterated here that the low-power laser beam 14, having a frequency at or above the optical absorption frequency of the superconducting material, does not heat the material above the critical temperature, but rather causes only the depairing of electrons to normalize the superconductor to have a finite resistance.

Figure 5:
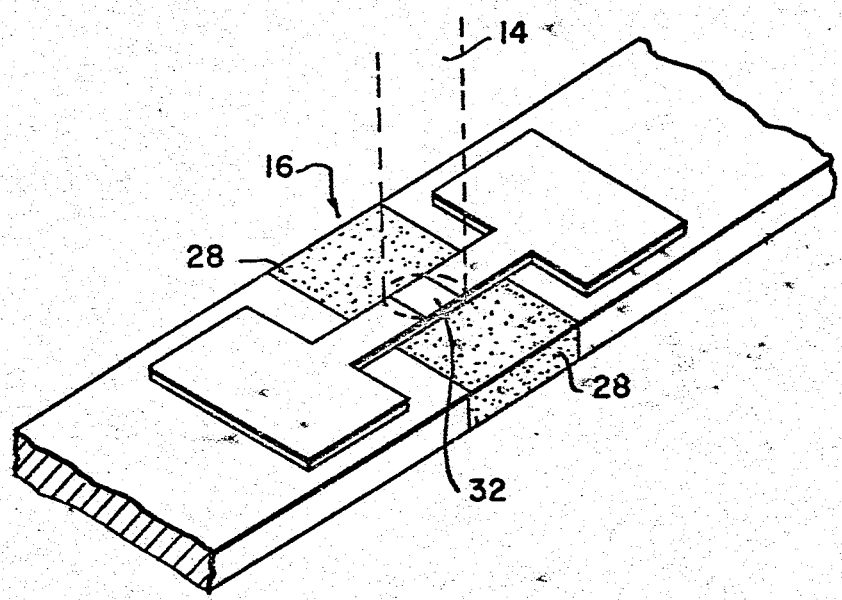
FIG. 5 is another embodiment using a thin film insulator between the laser-illuminated superconductor.

Referring now to FIG. 5 still another embodiment of the invention is shown. The superconductor element 24 in the form of a capital "I" is electrically connected at its ends to the superconductor strip 26 as in previously discussed embodiments. The ceramic piece 28 is bonded to and mechanically and electrically isolates the two ends of the superconducting strip 26. The significant difference in this embodiment is that a thin film insulator 32 is interposed in a hiatus at the center of the "I" and interrupts the continuity of the superconductor 24 at the center. This thin film insulator 32 in the hiatus must be 10 Anstroms or less in thickness and may be deposited by well known techniques such as vacuum disposition. The laser beam 14 impinges upon the superconductor 24 and the thin film insulator 32, and as in the other embodiments, must be somewhat larger than the width of the central portion of the "I" section.

The operation of this embodiment is somewhat similar to that of the embodiment of FIG. 3. Tunnelling occurs during superconduction of the element 24, attaining substantially zero resistance for the superconductor switch 16. Again upon the superconductor element going normal due to impingement of the laser beam 14, the tunnelling ceases. Therefore the superconductor switch 16 presents substantially an open circuit and thus is a better switch than some of the other embodiments if low current capacity can be tolerated.

Further, if desired, any of the superconductor switches according to the invention, may be constructed to be electrically in series, parallel, and series-parallel in well known configurations.

Obviously, many modifications and variations of the present invention are possible in light of the above teachings. It is therefore to be understood that within the scope of the appended claims, the invention may be practice otherwise than as specifically described.

What is claimed is:

1. A laser activated superconducting switch comprising:
    a superconducting material in the form of a strip cut to have opposing ends physically and electrically separated from each other, and maintained at a temperature below its critical transition temperature to thereby be superconducting;
    a ceramic piece interposed between the opposing ends and substantially flush with the surfaces of said superconducting material strip for electrical insulation and mechanical support;
    a cryogenic container for containing said superconducting material;
    a window in said container in optical alignment with said conductor and of such material as will transmit the frequency of a desired laser beam;
    a laser outside said container emitting a low power beam, and having a frequency at or above the optical frequency of said superconducting material, to pass through said window when desired to impinge upon said superconducting material to normalize the same;
    whereby said switch may be normalized remotely and no heating in said superconducting material occurs within said container.

2. The laser activated superconducting switch of claim 1 wherein:
    a superconductor spans said ceramic piece, extending to and electrically connected to the surfaces of said strip of superconducting material.

3. The laser activated superconducting switch of claim 2 wherein:
    said superconductor is in the form of a capital "I" wherein the cross bars are electrically connected to the surfaces of said strip of superconducting material, and the web spans said ceramic piece.

4. The laser activated superconducting switch of claim 1 wherein:
    a thin film ceramic is deposited over and bonded to the surface of said superconducting material ends and said ceramic piece; and
    a superconductor overlies said thin film ceramic, spanning said ceramic piece, extending to and bonded to the thin film ceramic overlying the surfaces of said strip of superconducting material.

5. The laser activated superconducting switch of claim 4 wherein:
    said superconductor is in the form of a capital "I" wherein the crossbars are bonded to said thin film ceramic overlying said superconductor material, and said web spans said ceramic piece;
    whereby when superconduction occurs, conductive tunnelling occurs through said thin film ceramic deposition, and when normalization occurs via the laser beam, superconduction and tunnelling cease.

6. The laser activated superconducting switch of claim 1 wherein:
    said strip of superconducting material is reduced in cross section to form a narrow and thin strip in a portion of said material.

7. The laser activated superconducting switch of claim 6 further comprising:
    a ceramic piece surrounding three sides of said reduced cross section, leaving a portion thereof exposed for the impingement of said laser beam.

8. The laser activated superconducting switch of claim 1 wherein:
    a superconductor spans said ceramic piece extending to and electrically connected to the surfaces of said strip of superconducting material, said superconductor having a hiatus in the span over said ceramic piece; and
    a thin film ceramic deposited in said hiatus of said superconductor spanning said ceramic piece;
    whereby when superconduction occurs, conductive tunnelling occurs through said thin film ceramic deposited in said hiatus.

9. The laser activated superconducting switch of claim 8 wherein:
    said superconductor is in the form of a capital "I" wherein the cross bars are electrically and physically bonded to the surfaces of the ends of said strip of superconducting material.

* * * * *